(12) United States Patent
Boedt et al.

(10) Patent No.: US 9,082,819 B2
(45) Date of Patent: Jul. 14, 2015

(54) PROCESS FOR THINNING THE ACTIVE SILICON LAYER OF A SUBSTRATE OF "SILICON ON INSULATOR" (SOI) TYPE

(71) Applicant: Soitec, Crolles Cedex (FR)

(72) Inventors: Francois Boedt, Meylan (FR); Sebastien Kerdiles, Saint Ismier (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/382,738

(22) PCT Filed: Jan. 30, 2013

(86) PCT No.: PCT/IB2013/000147
§ 371 (c)(1),
(2) Date: Sep. 3, 2014

(87) PCT Pub. No.: WO2013/136146
PCT Pub. Date: Sep. 19, 2013

(65) Prior Publication Data
US 2015/0031190 A1  Jan. 29, 2015

(30) Foreign Application Priority Data
Mar. 12, 2012 (FR) .................... 12 52203

(51) Int. Cl.
*H01L 21/84* (2006.01)
*H01L 21/02* (2006.01)
(Continued)

(52) U.S. Cl.
CPC .... *H01L 21/76256* (2013.01); *H01L 21/02019* (2013.01); *H01L 21/02164* (2013.01); *H01L 21/02238* (2013.01); *H01L 21/02252* (2013.01);
(Continued)

(58) Field of Classification Search
CPC ............... H01L 21/02225; H01L 21/02252; H01L 21/0223; H01L 21/02038; H01L 21/30604; H01L 21/7624; H01L 21/76256
USPC .................... 438/149, 457, 459, 479
See application file for complete search history.

(56) References Cited

U.S. PATENT DOCUMENTS

2004/0121598 A1 6/2004 Achutharaman
2009/0035920 A1* 2/2009 Neyret et al. .............. 438/458

FOREIGN PATENT DOCUMENTS

EP 1705704 A1 9/2006
WO 2012012138 A2 1/2012

OTHER PUBLICATIONS

International Search Report for International Application No. PCT/IB2013/000147 dated Mar. 26, 2013, 4 pages.
(Continued)

*Primary Examiner* — Thanhha Pham
(74) *Attorney, Agent, or Firm* — TraskBritt

(57) ABSTRACT

The invention relates to a process for thinning the active silicon layer of a substrate, which comprises an insulator layer between the active layer and a support, this process comprising one step of sacrificial thinning of active layer by formation of a sacrificial oxide layer by sacrificial thermal oxidation and deoxidation of the sacrificial oxide layer. The process is noteworthy in that it comprises: a step of forming a complementary oxide layer on the active layer, using an oxidizing plasma, this layer having a thickness profile complementary to that of oxide layer, so that the sum of the thicknesses of the oxide layer and of the sacrificial silicon oxide layer are constant over the surface of the treated substrate, a step of deoxidation of this oxide layer, so as to thin active layer by a uniform thickness.

17 Claims, 6 Drawing Sheets

(51) Int. Cl.
*H01L 21/762* (2006.01)
*H01L 21/66* (2006.01)
*H01L 21/306* (2006.01)

(52) U.S. Cl.
CPC .... *H01L 21/02255* (2013.01); *H01L 21/30604* (2013.01); *H01L 21/7624* (2013.01); *H01L 22/12* (2013.01); *H01L 22/20* (2013.01)

(56) References Cited

OTHER PUBLICATIONS

Sang et al, Ultraprecision Finishing Technique by Numerically Controlled Sacrificial Oxidation, Journal Crystal Growth, vol. 310, (2008), pp. 2173-2177.

* cited by examiner

PROCESS FOR THINNING THE ACTIVE SILICON LAYER OF A SUBSTRATE OF "SILICON ON INSULATOR" (SOI) TYPE

CROSS-REFERENCE TO RELATED APPLICATIONS

This application is a national phase entry under 35 U.S.C. §371 of International Patent Application PCT/IB2013/000147, filed Jan. 30, 2013, designating the United States of America and published in English as International Patent Publication WO 2013/136146 A1 on Sep. 19, 2013, which claims the benefit under Article 8 of the Patent Cooperation Treaty and under 35 U.S.C. §119(e) to French Patent Application Serial No. 1252203, filed Mar. 12, 2012, the disclosure of each of which is hereby incorporated herein in its entirety by this reference.

TECHNICAL FIELD

The invention lies in the field of the manufacture of substrates for applications in the fields of electronics, optics and/or optoelectronics.

The present invention relates more specifically to a process for thinning the active silicon layer of a substrate intended for applications in the aforementioned fields.

BACKGROUND

Among the aforementioned substrates, there is, in particular, a substrate known under the acronym "SOI" (which stands for "Silicon On Insulator"), in which an insulator layer, generally an oxide layer, is inserted and buried between a surface silicon active layer and a support substrate.

The expression "active layer" denotes a layer of semiconductor material (of silicon in the case of an SOI), in which and/or on which components for electronics, optics and/or optoelectronics will be subsequently manufactured.

Such substrates are generally obtained by molecular bonding of a donor substrate made of silicon to a support substrate, one and/or the other of these two substrates being covered, prior to the bonding, with an insulator layer, then by detachment of the active silicon layer from the donor substrate along a weakened zone.

This weakened zone is, for example, obtained by implantation of atomic species, for example, according to the process known under the trademark SMARTCUT®.

The SOI substrates thus obtained are generally subjected to finishing steps that aim to thin the thickness of the active silicon layer that was transferred to the support substrate.

Already known from the prior art is a thinning process known under the name "sacrificial oxidation/deoxidation," which consists of carrying out a thermal oxidation of the surface portion of the active silicon layer, so as to form a layer of silicon oxide ($SiO_2$), then in carrying out a deoxidation (removal) of this sacrificed oxide layer.

This thermal oxidation is generally carried out by subjecting the active silicon layer to a temperature between 700° C. and 1100° C. for a duration of a few minutes to a few hours, depending on the desired oxide thickness, in a conventional furnace for dry or wet oxidation.

The thickness of the thermal silicon oxide ($SiO_2$) thus formed is unfortunately not uniform. This uniformity is also extremely difficult to control during the sacrificial oxidation step itself.

Consequently, after the removal of this thermal oxide layer (deoxidation), the residual thickness of the active silicon layer is no longer uniform. There is, therefore, a sizeable degradation of the active silicon layer between its step of transfer to the support and its finished state.

It would, therefore, be desirable to improve this thinning process.

This problem is faced even more during the production of a substrate known under the acronym "FDSOI" (which stands for "Fully Depleted Silicon On Insulator"), in which the surface active silicon layer has a thickness between approximately 5 and 30 nanometers, typically between 5 and 12 nm.

It is easily understood that a thickness irregularity in an extremely thin layer may be particularly problematic, since if the silicon layer obtained after the oxidation/deoxidation step is too thin or too thick at certain points, the electrical properties of the components that will be subsequently manufactured thereon risk being greatly degraded.

This problem is also faced whether the FDSOI substrate is of the type in which the thickness of the buried oxide layer is close to 150 nanometers or is of the type in which the thickness of this layer is less than or equal to 30 nanometers, as in the substrates known under the acronym "FDSOI UTBOX" (which stands for "Fully Depleted Silicon On Insulator Ultra Thin Buried Oxide").

Among the electrical characteristics that may be greatly affected by variations of the thickness of the active silicon layer, is the threshold voltage of FDSOI transistors; that is to say, the voltage below which the transistor is said to be "OFF" and above which it is said to be "ON." The sensitivity of the threshold voltage—to the thickness variations of the active layer is of the order of 25 mV/nm.

The continuous miniaturization of transistors leads to narrowing of the tolerance interval in which the threshold voltage of all the transistors of a single component must be found and, therefore, in reducing the tolerated variations of the thickness of the active layer.

DISCLOSURE

The objective of the invention is, therefore, to provide a process for thinning the surface layer of silicon of an SOI substrate, which makes it possible to obtain a silicon layer that is thinned by a thickness that is as uniform as possible.

For this purpose, the invention relates to a process for thinning the active silicon layer of a "silicon on insulator" (SOI) substrate, intended for applications in the field of electronics, optics and/or optoelectronics, and that comprises an insulator layer buried between the active silicon layer and a support, this process comprising at least one step of sacrificial thinning of the active silicon layer by formation of a sacrificial silicon oxide layer by sacrificial thermal oxidation and deoxidation of this layer.

In accordance with the invention, this process also comprises:
  a step of forming an oxide layer, referred to as a "complementary" oxide layer, on the active silicon layer, using an oxidizing plasma, this complementary oxide layer having a thickness profile complementary, or substantially complementary, to that of the sacrificial silicon oxide layer, so that the sum of the thicknesses of the complementary oxide layer and of the sacrificial silicon oxide layer are constant, or substantially constant, over the entire surface of the treated substrate,
  a step of deoxidation of this complementary oxide layer,
  so as to thin the active silicon layer by a uniform thickness, at the end of all of these steps.

Owing to these features of the invention, the overall thinning obtained is uniform, since it combines the removal of the non-uniform oxide layer formed during the sacrificial oxidation with the removal of the complementary oxide, which compensates for the profile of the sacrificial oxide layer.

According to other advantageous and non-limiting features of the invention, taken alone or in combination:

- the step of forming the complementary oxide using an oxidizing plasma is carried out in a reactive-ion etching type reactor with capacitive coupling and adjustable magnetron effect, at a pressure of the order of 10 to 200 mTorr (i.e., from 1 to 30 Pa) of pure oxygen, for a duration of 10 to 90 seconds, with an RF power density between 0.3 and 3 W/cm$^2$,
- the formation of the sacrificial silicon oxide layer is carried out by wet oxidation at a temperature between 750° C. and 1200° C.,
- the formation of the sacrificial silicon oxide layer is carried out by dry oxidation at a temperature between 750° C. and 1200° C.,
- the sacrificial silicon oxide layer has a thickness that is larger in its central portion and progressively smaller going toward its annular periphery, and in that the complementary oxide layer is produced so as to have a thickness that is smaller in its central portion and progressively, larger going toward its annular periphery,
- the sacrificial silicon oxide layer has a thickness that is smaller in its central portion and progressively larger going toward its annular periphery, and in that the complementary oxide layer is produced so as to have a thickness that is larger in its central portion and progressively smaller going toward its annular periphery,
- a density gradient of the ionized species and/or of the radicals of the oxidizing plasma is created between the central portion and the annular periphery of the substrate, by injecting less gas into the portion where it is desired to obtain a lesser thickness and progressively more gas on going toward the portion where it is desired to obtain a larger thickness,
- a density gradient of the ionized species and/or of the radicals of the oxidizing plasma is created between the central portion and the annular periphery of the substrate, by defocusing these ionized species and/or these radicals in the portion where it is desired to obtain a lesser thickness and by progressively concentrating the latter on going toward the portion where it is desired to obtain a larger thickness, by virtue of magnets surrounding the plasma chamber,
- a density gradient of the ionized species and/or of the radicals of the oxidizing plasma is created between the central portion and the annular periphery of the substrate, by placing the substrate on a base comprising several independent heating zones and by maintaining a temperature that is lower in the portion where it is desired to obtain a lesser thickness and that is gradually higher on going toward the portion where it is desired to obtain a larger thickness,
- a density gradient of the ionized species and/or of the radicals of the oxidizing plasma is created between the central portion and the annular periphery of the substrate, by placing the substrate on an electrode composed of several sub-electrodes that are powered independently of one another and by powering the sub-electrodes located at the portion where it is desired to obtain a lesser thickness at a given power and by progressively powering those located going toward the portion where it is desired to obtain a larger thickness, at a higher power,
- the deoxidation of the sacrificial silicon oxide layer and/or of the complementary oxide layer is carried out by treatment with hydrofluoric acid (HF),
- the steps of forming the complementary oxide layer and of removing the latter are carried out before the sacrificial thinning step,
- the steps of forming the complementary oxide layer and of removing the latter are carried out after the sacrificial thinning step,
- the steps of forming the complementary oxide layer and the sacrificial silicon oxide layer are carried out before a single step of a sacrificial deoxidation of these two layers,
- the active silicon layer of the SOI substrate was obtained by detachment along a weakened interface formed in a "donor" substrate, and transfer to the support, in that the process comprises two steps of smoothing by rapid thermal annealing (RTA), and in that the sacrificial thinning step is carried out between the first and the second rapid thermal annealing (RTA) step, and the steps of forming the complementary oxide layer and of the deoxidation thereof are carried out after the second rapid thermal annealing (RTA) step,
- the rapid thermal annealing (RTA) treatment comprises subjecting the substrate to a temperature between 950° C. and 1350° C. for 10 to 90 seconds approximately.

BRIEF DESCRIPTION OF THE DRAWINGS

Other features and advantages of the invention will appear from the description, which will now be given, with reference to the appended drawings, which represent, by way of indication but non-limitingly, various possible embodiments.

In these drawings.

DETAILED DESCRIPTION

Figure 1A:
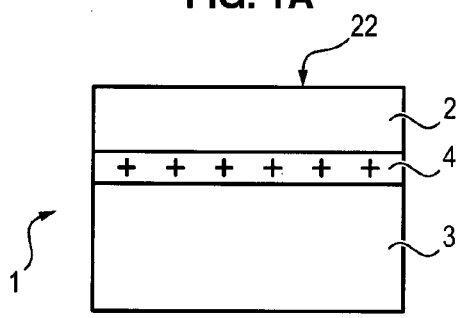
FIGS. 1A to 1C are diagrams representing the various steps of thinning the active layer of an SOI substrate by the sacrificial oxidation/deoxidation technique in accordance with the prior art.

The process in accordance with the invention applies to a "silicon on insulator" (SOI) substrate 1, such as that represented, for example, in FIG. 1A.

It comprises an insulator layer 4, generally a layer of silicon oxide (SiO$_2$), buried between an active surface silicon layer 2 and a support substrate 3.

Figure 1B:
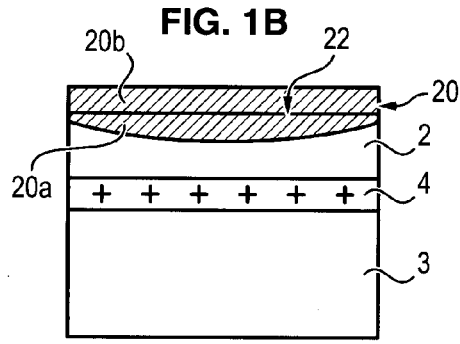
Figure 1C:
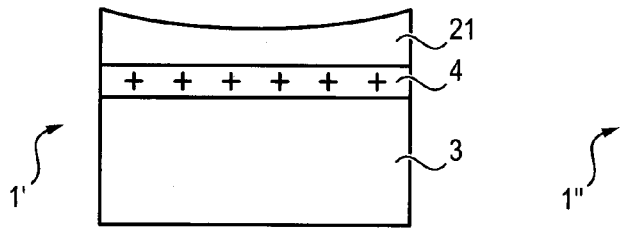

FIGS. 1B and 1C illustrate the thinning process in accordance with the prior art, according to which a sacrificial thermal oxidation of the active surface silicon layer 2 is carried out.

The processing parameters for this sacrificial oxidation are described below.

It is a surface treatment that aims to create a thin oxide layer 20 on the surface and in the upper portion of the silicon layer 2 by exposing the substrate 1 to an oxidizing agent at high temperature. The oxidation of the silicon is thus generally carried out between 750° C. and 1200° C. This layer is referred to as "sacrificial silicon oxide layer 20."

This process may, in particular, use steam (it is then referred to as wet oxidation), or else dioxygen (it is then referred to as dry oxidation). The corresponding reactions are:

$$Si + 2H_2O \rightarrow SiO_2 + 2H_2 \quad \text{(wet oxidation)}$$

$$Si + O_2 \rightarrow SiO_2 \quad \text{(dry oxidation)}$$

Wet oxidation is faster but allows an oxide having a quality inferior to that obtained by dry oxidation to be obtained.

The oxidizing gas may also contain a few percent of hydrochloric acid (HCl) in order to eliminate the metal ions that may be found therein.

The sacrificial silicon oxide layer 20 is formed both by a consumption of the silicon of the layer 2 and by the oxygen provided by the ambient gas. Thus, the sacrificial silicon oxide layer 20 increases both toward the inside of the substrate (numerical reference 20a) and toward the outside (numerical reference 20b) of the substrate.

It is considered that approximately 46% of the silicon oxide layer 20 extends below the original surface 22 (also known as the front face of the substrate) and 54% extends above. In other words, the portion 20b corresponds approximately to this 54%.

Depending on the desired thickness of the oxide layer and the oxidation temperature, the oxidation time is generally between a few minutes and a few hours.

The overall thickness of the formed sacrificial oxide layer is generally between 50 and 500 nm, typically between 100 and 300 nm.

The thermal oxidation of the silicon is often carried out using furnaces that comprise one or more tubes, into which the substrates to be treated are charged. For SOI substrates of large diameter, the oxidation is more uniform since it is carried out in vertical tube furnaces, in which the substrates are placed horizontally, one underneath the other.

It is, however, observed that the thickness of the sacrificial silicon oxide layer 20 is not uniform over the whole of the surface of the substrate 1.

Generally, and as is represented schematically in FIG. 1B, the formation of the oxide leads to a greater consumption of silicon in the central portion of the layer 2 and, therefore, the formation of a convex silicon oxide layer 20 (which is thicker at its center).

Thus, by way of example, a sacrificial silicon oxide layer 20, the thickness of which in its central portion is of the order of 50 nm, will have a thickness in its peripheral annular portion of the order of 49.5 nm and such a layer, the thickness of which in its central portion is of the order of 500 nm, will have a thickness in its peripheral annular portion of the order of 497 nm.

Such thickness variations may be observed, for example, using an ellipsometer. Ellipsometry is an optical technique for surface characterization and analysis, based on the change of state of polarization of light, by reflection of light on the surface observed.

The removal of the sacrificial silicon oxide layer 20 or "sacrificial deoxidation" is an etching operation generally carried out by wet etching.

In the case of the removal of a silicon oxide layer, the agent ensuring the chemical etching is based on hydrofluoric acid (HF). Depending on the concentration of the HF acid, the etching speed is typically of the order of 6 nm per minute with hydrofluoric acid (HF) at a weight concentration of 1%, or 60 nm per minute with hydrofluoric acid (HF) having a weight concentration of 10%.

Thus, by using a solution of HF with the latter concentration, by way of example, for an oxide having a thickness close to 50 nm, the actual deoxidation lasts around 1 minute and for an oxide of 500 nm, it lasts around 10 minutes.

The step of wet etching of the oxide with hydrofluoric acid (HF) is generally integrated into a cleaning sequence carried out in a cleaning bench, known as "wet bench."

Such a cleaning step is, for example, carried out by immersing the substrate 1 in a bath of a cleaning solution known under the terminology "SC-1," which stands for "Standard Cleaning 1" and which contains a mixture of ammonium hydroxide ($NH_4OH$), hydrogen peroxide ($H_2O_2$) and water. The typical weight concentrations of $NH_4OH$ and $H_2O_2$ are, respectively, of the order of 1 to 6% and 2 to 6%.

After the removal of the sacrificial silicon oxide layer 20, the thickness of which is not uniform, a thinned silicon surface layer 21 is obtained that is thinner at its center than at its edges; that is to say, of concave shape, as can be seen in FIG. 1C. The substrate thus obtained bears the reference 1'.

It will be noted that, under certain conditions, it is also possible to obtain the reverse; that is to say a sacrificial oxide layer that is thicker at its periphery than at its center (i.e., concave) and, therefore, conversely a convex thinned silicon layer. However, this case is much less frequent than the previous one.

Among the parameters capable of resulting in a thicker oxidation at the center or, conversely, at the edge, are, for example, the partial pressure and the flow rate of the various gases injected during the oxidation and the possible temperature ramp during the oxidation (the cause of a possible temperature gradient between the edge and the center of the wafers).

The thinning process in accordance with the invention makes it possible to overcome these drawbacks. A first embodiment thereof will now be described with reference to FIGS. 2A to 2C.

This thinning process applies to an SOI substrate 1, such as that represented in FIG. 1A, and comprises a step of sacrificial oxidation, then a step of sacrificial deoxidation, that are identical to those described in connection with FIGS. 1B and 1C. These steps will not, therefore, be described again for the purposes of simplification.

Figure 2A:
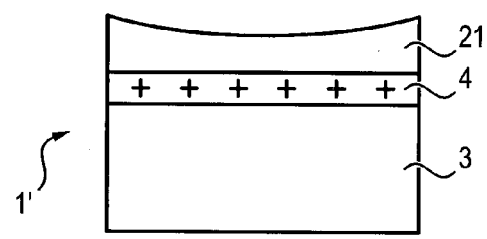
FIGS. 2A to 2C, 3A to 3D and 4A to 4D are diagrams representing the various steps, respectively, of a first, second and third embodiment of the thinning process in accordance with the invention.

The process in accordance with the invention continues on the thinned SOI substrate 1' (it will be noted that FIGS. 1C and 2A are identical).

This thinned substrate 1' is subjected to a step of forming a "complementary" oxide layer 5.

The term "complementary" denotes a layer whose thickness profile complements that of the sacrificial silicon oxide layer 20 formed previously, so that the sum of the thicknesses of the complementary oxide layer 5 and of the sacrificial oxide layer 20 over the entire surface of the treated substrate (referenced 1 then 1') is constant or substantially constant. In other words, the thickness of the complementary oxide layer 5 is smaller at the locations where the sacrificial oxide layer 20 is thicker, and vice versa, so as to compensate for the thickness non-uniformity of the sacrificial oxide layer 20.

Figure 2B:
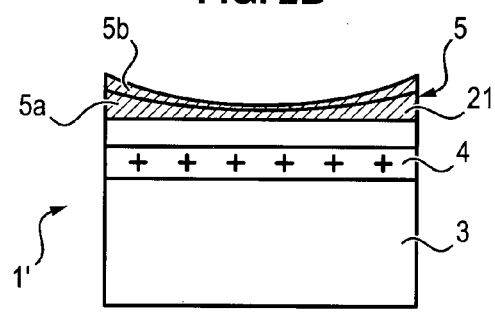

Thus, in the example represented in FIG. 2B, the complementary oxide layer 5 is thinner at its center and gradually thicker going toward its annular periphery.

As described previously for the sacrificial oxide layer 20, the complementary oxide layer 5 increases both toward the inside (numerical reference 5a) by consuming silicon and toward the outside (numerical reference 5b) of the substrate. Following the example of what is described for the complementary oxide 5, the contributions 5a and 5b are both thicker at the annular periphery of the substrate than at its center.

The processing parameters for this complementary oxidation are described below.

This complementary oxidation is carried out by subjecting the thinned silicon layer 21 of the substrate 1' to an oxidizing plasma.

This oxidizing plasma may be formed with the aid of equipment used in the field of microelectronics, for carrying out dry etching, for example, RIE (reactive-ion etching) equipment, or else for carrying out dry cleaning operations, known as "stripping" operations.

The substrate to be treated is placed on an electrode (anode or cathode) inside the chamber of a plasma-generating reactor. A counter electrode (cathode or anode) is also placed in the chamber in addition to a (radio-frequency) power generator. The reactive gases are introduced into the chamber. The application of an electric discharge between the two electrodes leads to the ionization of a portion of the gas. The species present in this plasma, namely, ionized and/or electrically neutral atoms and/or molecules, and radicals, may then react with the substrate.

The various technologies for forming the plasma differ by the type of discharge (alternating or direct), the operating pressure (atmospheric or low pressure), the type of coupling between the power generator and the chamber in which the plasma is generated (capacitive or inductive), and the electrode on which the substrate to be treated is placed (anode or cathode).

The oxidizing plasma makes it possible to generate a very thin complementary silicon oxide layer, the average thickness on the substrate is between 3 and 20 nm, typically between 5 and 10 nm.

In the case of equipment of the aforementioned RIE type, for example, an exposure of the silicon surface for around 30 seconds to a pure oxygen plasma makes it possible to form 5 to 10 nm of silicon oxide ($SiO_2$) according to pressures typically between 10 and 200 mTorr (i.e., approximately between 1 and 30 Pa) and a power typically from 0.3 to 3 W/cm$^2$.

Depending on the operating principle of the equipment used, the growth of—the complementary oxide may be governed by the ionized species physically bombarding the surface of the treated layer (here, the silicon layer 21) and/or the radicals chemically reacting with this surface (e.g., the positive ions that have captured an electron before reacting chemically with the substrate).

For each of the plasma technologies available for producing a complementary thin oxide, there are one or more parameters on which it is possible to act in order to obtain an oxide having a thickness that can be voluntarily larger at the edge than at the center (or vice versa if the silicon layer 21 has a profile that is thicker at the center and thinner at the edge).

It is, for example, possible to create a density gradient of ionized species and/or of radicals between the edge and the center of the substrate, by injecting more gas at the center than at the edge or vice versa, or else by concentrating or by defocusing these species owing to an adjustable system of magnets surrounding the plasma chamber (magnetron effect).

It is also possible to grow an oxide that is larger at the edge than at the center by maintaining a higher temperature at the edge than at the center, or vice versa, owing to a base comprising several independent heating zones.

It is also possible to place the substrate to be plasma oxidized on an electrode composed of several sub-electrodes powered independently of one another, and by powering the sub-electrodes of the edge with a greater power than those of the center, or vice versa, so as to oxidize the edge more than the center, or vice versa.

It will be noted that according to a simplified embodiment variant of the invention, it is chosen to produce a complementary oxide layer 5, the thickness of which will be thinner overall (or, conversely, thicker) at the center and gradually thicker (respectively thinner) going toward its annular periphery, but without carrying out a precise measurement of the actual profile of the thinned silicon layer 21, such as that which could be obtained, for example, by ellipsometry.

However, according to an improved embodiment variant of the invention, it would be possible to make a precise plot of the profile (mapping), for example, by ellipsometry, and to then refine the parameters for adjusting the thickness of the complementary oxide layer as a function of the values of the thicknesses of the thinned silicon layer 21 measured at various points thereof.

Figure 2C:
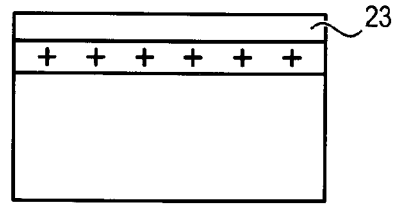

The removal of the complementary oxide 5 is then carried out, as represented in FIG. 2C, so that an SOI substrate 1" is obtained that has an even thinner silicon layer, referenced 23 and the thickness of which is constant or virtually constant over the entire surface of the substrate.

This removal of the complementary oxide 5 is carried out in the same manner as the removal of the sacrificial oxide 20, namely, by deoxidation.

Reference will be made regarding this subject to the deoxidation techniques described previously.

Since the complementary oxide 5 obtained by plasma is thinner, the deoxidation time and/or the concentration of hydrofluoric acid (HF) may be reduced in proportion. Typically, in order to remove around 6 nm of complementary oxide 5 using a 1% by volume solution of hydrofluoric acid, a deoxidation of the order of one minute is sufficient.

A second embodiment of the process in accordance with the invention will now be described with reference to FIGS. 3A to 3D. The elements identical to those described in connection with the first embodiment bear the same numerical references for the purposes of simplification and will not be described again in detail.

This embodiment differs from the preceding one in that the step of forming the complementary oxide 5 is carried out before the formation of the sacrificial silicon oxide layer 20 and not after.

Figure 3A:
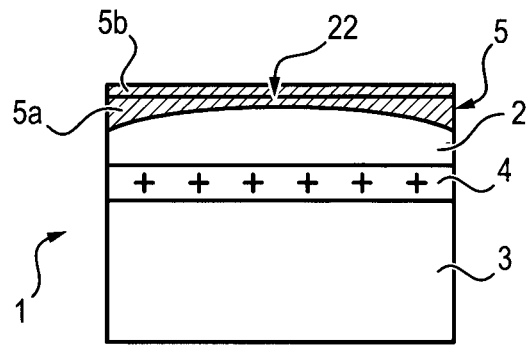
Figure 3B:
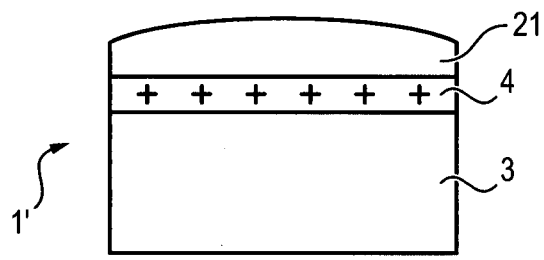

The complementary oxide 5 is formed on the SOI substrate 1 by one of the aforementioned techniques, so that the oxidized substrate represented in FIG. 3A is obtained.

This complementary oxide is formed by anticipating the thickness difference that the sacrificial silicon oxide layer 20 will subsequently have. Thus, if it is known that the technique that will be used for the formation of the sacrificial oxide layer 20 will result in a layer being formed having a thickness that is larger in the center than at the edges, it will be anticipated by forming a complementary oxide layer 5 having a thickness that is larger at the edges than at the center. The reverse also applies.

The deoxidation of the complementary oxide layer 5 is then carried out by one of the aforementioned deoxidation techniques and the substrate referenced 1' is obtained that has a thinned surface silicon layer 21. In the example represented in FIG. 3B, this thinned layer 21 is thicker at its center than at its edges and has a convex shape.

Figure 3C:
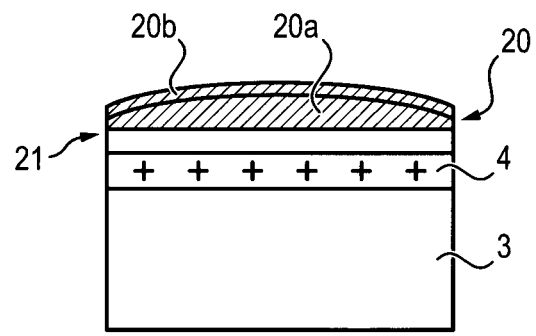
Figure 3D:
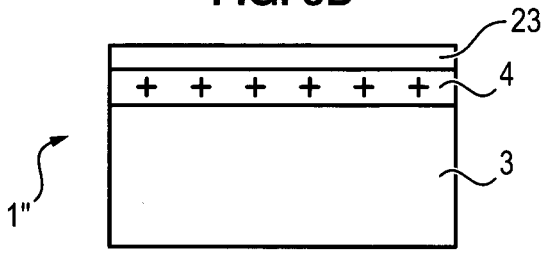

The next step, represented in FIG. 3C, corresponds to the formation of the sacrificial oxide layer 20 and the subsequent step, represented in FIG. 3D, to the deoxidation of the oxide layer 20, in accordance with that which was described for the first embodiment. The SOI substrate 1" is obtained, the silicon layer 23 of which is even thinner than the layer 21, but above all, the thickness of which is constant or virtually constant over the entire surface of the substrate. The thickness uniformity of the SOI layer 23 is thus maintained, or even improved, after the overall finishing sequence.

A third embodiment of the invention is represented in FIGS. 4A to 4D. It differs from the first and second embodiments in that not only is the step of forming the complementary oxide 5 carried out before the formation of the sacrificial silicon oxide layer 20, but also in that these two steps are carried out successively, without an intermediate deoxidation step of the complementary oxide layer 5 and with a single common deoxidation step of the complementary oxide layer 5 and of the sacrificial oxide layer 20. At the end of these two oxidation steps and the deoxidation step, the final SOI substrate 1" is obtained.

Figure 4A:
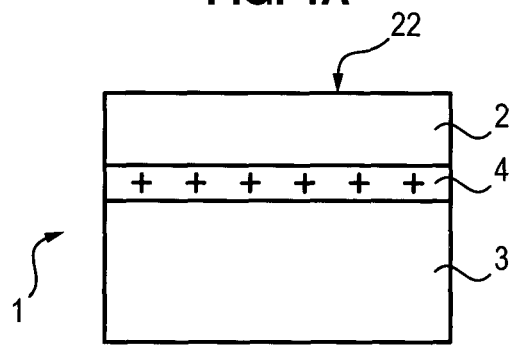
Figure 4B:
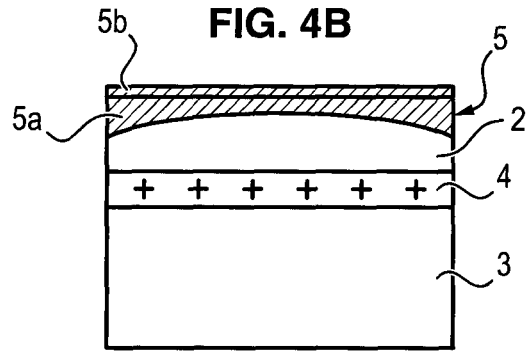
Figure 4C:
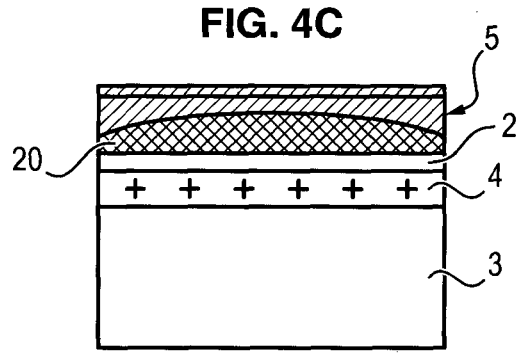
Figure 4D:
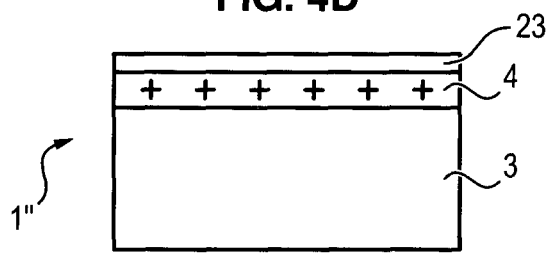

According to yet another variant, not represented in the figures, it is possible to proceed as in the third embodiment, but by reversing the steps represented in FIGS. 4B and 4C; that is to say, by first forming the sacrificial oxide layer 20, then the complementary oxide layer 5, before the overall deoxidation.

The process in accordance with the invention finds a particular application in the following process applied to an SOI substrate obtained immediately after the detachment from the rest of the silicon donor substrate (i.e., obtained post-splitting).

This process comprises the following successive steps:
a) first smoothing treatment of the surface of the silicon oxide layer 2 by rapid thermal annealing (RTA),
b) formation of a sacrificial oxide layer then sacrificial deoxidation,
c) second smoothing treatment of the surface of the thinned silicon oxide surface layer 21 by rapid thermal annealing (RTA),
d) formation of a new sacrificial oxide layer then sacrificial deoxidation,
e) formation of the complementary oxide layer followed by a deoxidation of this complementary oxide.

Steps d) and e) may be inverted.

As a reminder, rapid thermal annealing (RTA) is a process that typically lasts from a few milliseconds to a few seconds, or even one to two minutes. Unlike conventional furnaces (cf. oxidation furnaces), the RTA equipment enables the treatment of a wafer, both with temperature increase and decrease ramps that are very rapid (typically 50° C./s to 500° C./s, or even 1000° C./s).

In the present case, the maximum temperature is between 950° C. and 1350° C., typically of the order of 1200° C.; the annealing time is between approximately 10 and 90 seconds. The purpose of the RTA here is to cure crystalline defects optionally present in the active layer after the detachment carried out by implantation of atomic species in accordance with the process known under the trademark SMARTCUT®.

EXAMPLE

The result of a test carried out with an SOI substrate subjected to the aforementioned process, including the two RTA steps, will be given below with reference to FIGS. 5A to 5E.

Figure 5A:
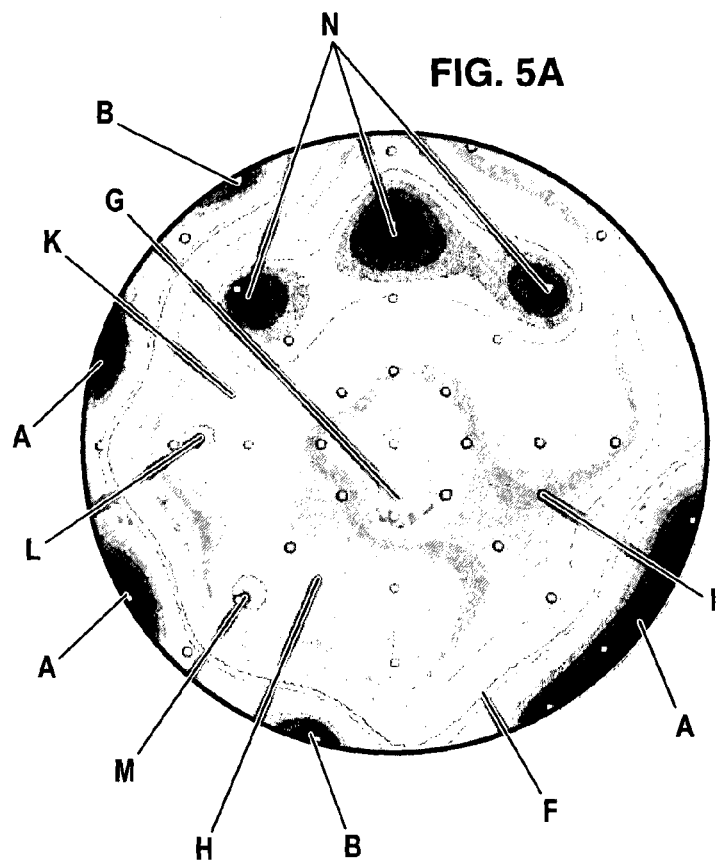
FIGS. 5A to 5E are figures representing measurement results obtained using an ellipsometer.

Following the second smoothing RTA step and, therefore, the first sacrificial oxidation/deoxidation step, a substrate is obtained, the surface silicon layer of which is represented in FIG. 5A. The difference between the zones of greater thickness and those of lesser thickness of silicon is 0.71 nm. However, as can be seen in the figure, there are significant thickness disparities between the center and the annular periphery, which is thicker.

Figure 5B:
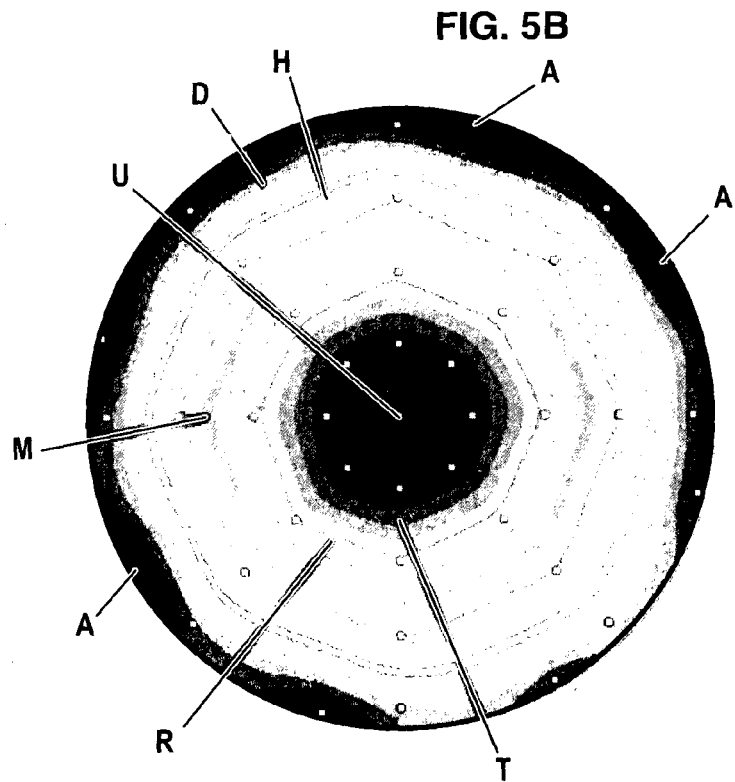
Figure 5C:
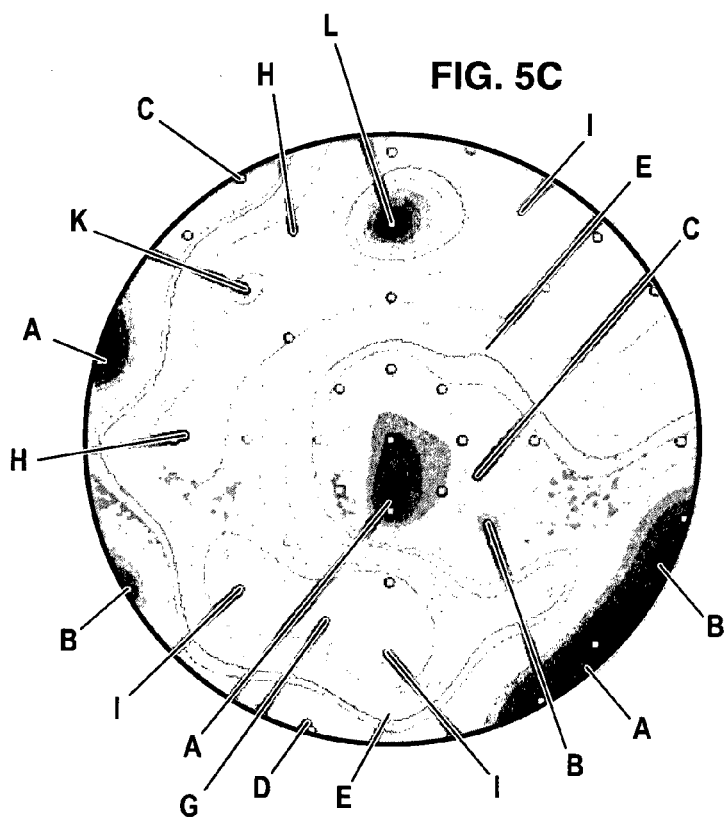
Figure 5C:
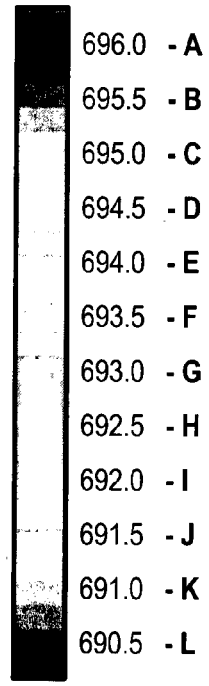

After formation of the complementary oxide layer on the silicon, the oxide layer represented in FIG. 5B is obtained, the silicon layer located below being represented in FIG. 5C. As can be seen in FIG. 5B, the oxide layer is thicker at the edge and its thickness decreases fairly evenly toward the center. This complementary oxidation profile was obtained by exposing the surface of the SOI to an oxygen-based plasma for 30 seconds at a pressure of the order of 50 mTorr and with a magnetron effect maximizing the oxidation at the edge compared to the center of the substrate.

Figure 5D:
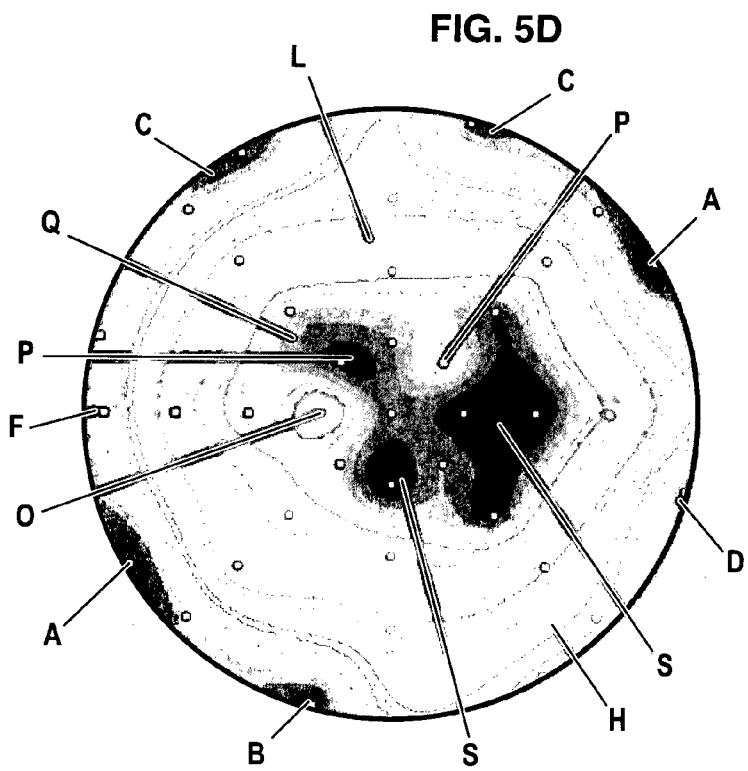
Figure 5D:
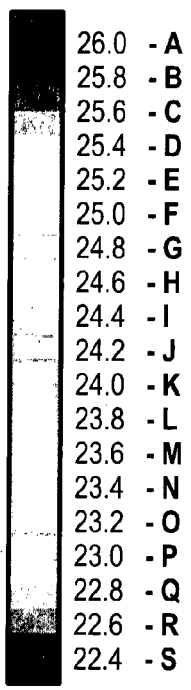

FIG. 5D illustrates the silicon consumed by the complementary oxidation.

Figure 5E:
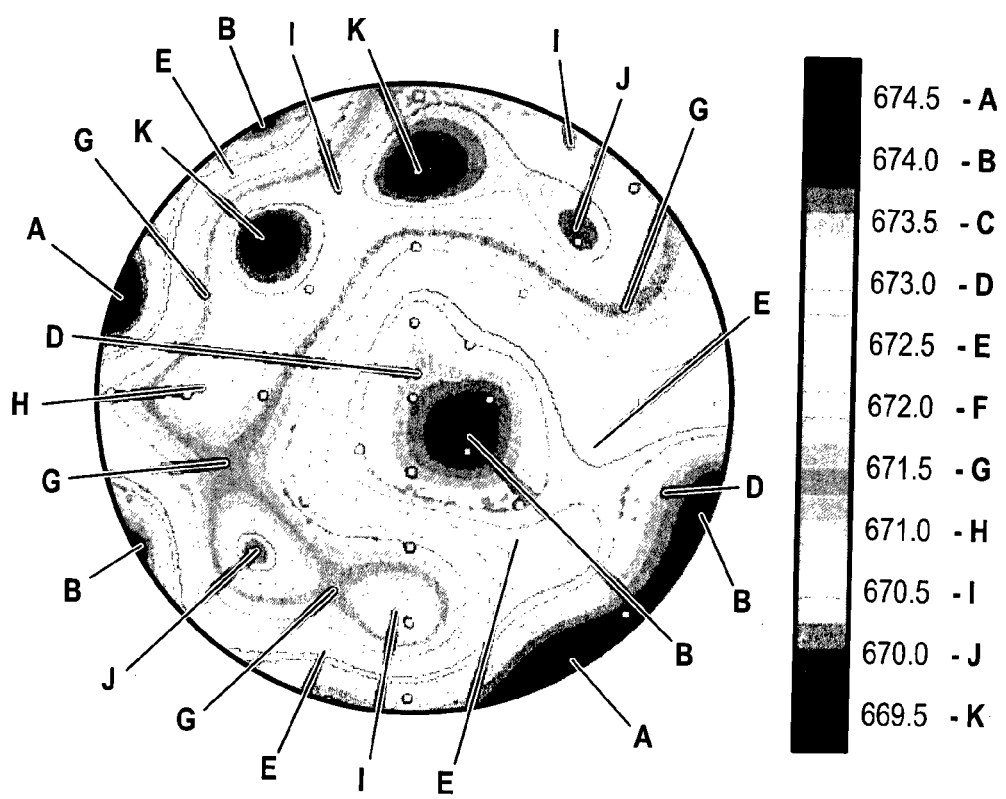

Finally, FIG. 5E shows the silicon obtained after the deoxidation of the complementary oxide. The difference between the zones of greater thickness and those of lesser thickness of silicon is no more than 0.55 nm. There is, therefore, a better uniformity of the thickness.

The invention claimed is:

1. A method for thinning an active silicon layer of a silicon-on-insulator (SOI) substrate having an insulator layer buried between the active silicon layer and a support, the method comprising:
   forming a sacrificial silicon oxide layer by sacrificial thermal oxidation of a portion of the active silicon layer;
   forming a complementary oxide layer on the active silicon layer using an oxidizing plasma, the complementary oxide layer having a thickness profile at least substantially complementary to a thickness profile of the sacrificial silicon oxide layer such that a sum of the thicknesses of the complementary oxide layer and the sacrificial silicon oxide layer are at least substantially constant over the entire surface of the SOI substrate; and
   removing the sacrificial silicon oxide layer; and
   removing the complementary oxide layer;
   wherein the thinned active silicon layer has an at least substantially uniform thickness after forming and removing each of the sacrificial silicon oxide layer and the complementary oxide layer.

2. The method of claim 1, wherein forming the complementary oxide layer using the oxidizing plasma is carried out in a reactive-ion etching reactor with capacitive coupling and adjustable magnetron effect, at a pressure on the order of 10 to 200 mTorr (from 1 to 30 Pa) of pure oxygen, for a duration of 10 to 90 seconds, with an RF power density between 0.3 and 3 W/cm$^2$.

3. The method of claim 1, wherein forming the sacrificial silicon oxide layer is carried out by wet oxidation at a temperature between 750° C. and 1200° C.

4. The method of claim 1, wherein forming the sacrificial silicon oxide layer is carried out by dry oxidation at a temperature between 750° C. and 1200° C.

5. The method of claim 1, wherein the sacrificial silicon oxide layer is relatively thicker in a central portion thereof and progressively relatively thinner towards an annular periphery thereof, and wherein the complementary oxide layer is thinner in a central portion thereof and progressively relatively thicker toward an annular periphery thereof.

6. The method of claim 5, further comprising creating a density gradient of at least one of ionized species and radicals of the oxidizing plasma between a central portion and an annular periphery of the SOI substrate by injecting less gas into a region where it is desired to obtain a lesser thickness of the complementary oxide layer and progressively more gas toward a region where it is desired to obtain a larger thickness of the complementary oxide layer.

7. The method of claim 5, further comprising creating a density gradient of at least one of ionized species and radicals of the oxidizing plasma between a central portion and an annular periphery of the SOI substrate by defocusing the at least one of the ionized species and the radicals in a region where it is desired to obtain a lesser thickness of the complementary oxide layer and by progressively concentrating the at least one of ionized species and radicals toward a region where it is desired to obtain a larger thickness of the complementary oxide layer using magnets surrounding the plasma chamber.

8. The method of claim 5, further comprising creating a density gradient of at least one of ionized species and radicals of the oxidizing plasma between a central portion and an annular periphery of the SOI substrate by placing the SOI substrate on a base having two or more independent heating zones and maintaining a relatively lower temperature in a region where it is desired to obtain a lesser thickness of the complementary oxide layer and a relatively higher temperature in a region where it is desired to obtain a larger thickness of the complementary oxide layer.

9. The method of claim 5, further comprising creating a density gradient of at least one of ionized species and radicals of the oxidizing plasma between a central portion and an annular periphery of the SOI substrate by placing the SOI substrate on an electrode having two or more independently powered sub-electrodes, and powering at least one of the sub-electrodes located in a region where it is desired to obtain a lesser thickness of the complementary oxide layer at a relatively lower power and powering at least one of the sub-electrodes located in a region where it is desired to obtain a larger thickness of the complementary oxide layer at a relatively higher power.

10. The method of claim 1, wherein the sacrificial silicon oxide layer is thinner in a central portion thereof and progressively thicker toward an annular periphery thereof, and wherein the complementary oxide layer is thicker in a central portion thereof and progressively thinner toward an annular periphery thereof.

11. The method of claim 1, wherein at least one of removing the sacrificial silicon oxide layer and removing the complementary oxide layer comprises treating with hydrofluoric acid (HF).

12. The method of claim 1, wherein the forming of the complementary oxide layer and the removing of the complementary oxide layer are carried out prior to the forming of the sacrificial silicon oxide layer and the removing of the sacrificial silicon oxide layer.

13. The method of claim 1, wherein the forming of the sacrificial silicon oxide layer and the removing of the sacrificial silicon oxide layer are carried out prior to the forming of the complementary oxide layer and the removing of the complementary oxide layer.

14. The method of claim 1, wherein the forming of the sacrificial silicon oxide layer and the forming of the complementary oxide layer are carried out prior to the removing of the sacrificial silicon oxide layer and the removing of the complementary oxide layer.

15. The method of claim 1, wherein the removing of the sacrificial silicon oxide layer and the removing of the complementary oxide layer are carried out in a single removal process.

16. The method of claim 1, further comprising forming the SOI substrate, forming the SOI substrate including transferring the active silicon layer to the support from a donor substrate by fracture of the donor substrate along a weakened interface formed in the donor substrate, and wherein the method further comprises smoothing a surface of the active silicon layer by first and second rapid thermal annealing (RTA) treatments, and wherein the forming of the sacrificial silicon oxide layer and the removing of the sacrificial silicon oxide layer are carried out between the first and the second RTA treatments, and wherein the fainting of the complementary oxide layer and the removing of the complementary oxide layer are carried out after the second RTA treatment.

17. The method of claim 16, wherein each of the first and the second RTA treatments comprises subjecting the SOI substrate to a temperature between 950° C. and 1350° C. for approximately 10 to 90 seconds.

* * * * *